US012666971B2

(12) United States Patent
Saito et al.

(10) Patent No.: US 12,666,971 B2
(45) Date of Patent: Jun. 23, 2026

(54) HIGH-FREQUENCY SEMICONDUCTOR PACKAGE

(71) Applicant: Mitsubishi Electric Corporation, Tokyo (JP)

(72) Inventors: Tetsunari Saito, Tokyo (JP); Seiichi Tsuji, Tokyo (JP); Hiroaki Minamide, Tokyo (JP); Ko Kanaya, Tokyo (JP); Shunichi Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 434 days.

(21) Appl. No.: 18/559,516

(22) PCT Filed: Oct. 13, 2021

(86) PCT No.: PCT/JP2021/037949
§ 371 (c)(1),
(2) Date: Nov. 7, 2023

(87) PCT Pub. No.: WO2023/062758
PCT Pub. Date: Apr. 20, 2023

(65) Prior Publication Data
US 2024/0234338 A1 Jul. 11, 2024

(51) Int. Cl.
*H10W 42/20* (2026.01)
*H10W 20/20* (2026.01)
(Continued)

(52) U.S. Cl.
CPC ......... *H10W 42/20* (2026.01); *H10W 70/635* (2026.01); *H10W 20/20* (2026.01);
(Continued)

(58) Field of Classification Search
CPC ............................................ H10W 44/00–209
See application file for complete search history.

(56) References Cited

U.S. PATENT DOCUMENTS 5,736,783 A * 4/1998 Wein ................... H10P 72/0438
257/691
6,222,259 B1 * 4/2001 Park ................... H10W 74/016
257/784
(Continued)

FOREIGN PATENT DOCUMENTS

CN 102428557 A * 4/2012 ............ H10W 44/20
JP 2005-050974 A 2/2005
(Continued)

OTHER PUBLICATIONS

International Search Report issued in PCT/ JP2021/037949; mailed Dec. 21, 2021.
(Continued)

*Primary Examiner* — Evren Seven
(74) *Attorney, Agent, or Firm* — Studebaker Brackett PLLC

(57) ABSTRACT

An input feedthrough (8) and an output feedthrough (9) provided on the substrate (3) are wire-connected to an input pad (5) and an output pad (6) of the semiconductor chip (4) respectively. A metal seal ring (12) is provided on the substrate (3) is electrically connected to the metal plate (1) by a through-hole (15). A conductive cap (14) is bonded to the metal seal ring (12) and covers a place above the semiconductor chip (4). Both ends of an isolation metal wire (13) are electrically connected to the metal plate (1) and a loop comes into contact with a lower surface of the conductive cap (14). The isolation metal wire (13) constitutes an isolation wall partitioning an inner space into a region including the input feedthrough (8) and a region including the output feedthrough (9).

10 Claims, 6 Drawing Sheets

(51) Int. Cl.

| | |
|---|---|
| *H10W 70/63* | (2026.01) |
| *H10W 72/50* | (2026.01) |
| *H10W 72/90* | (2026.01) |
| *H10W 90/00* | (2026.01) |

(52) U.S. Cl.
CPC .... *H10W 72/5434* (2026.01); *H10W 72/5453* (2026.01); *H10W 72/5473* (2026.01); *H10W 72/932* (2026.01); *H10W 72/942* (2026.01); *H10W 72/9445* (2026.01); *H10W 90/755* (2026.01); *H10W 90/756* (2026.01)

(56)          References Cited

U.S. PATENT DOCUMENTS

| | | | | |
|---|---|---|---|---|
| 7,030,469 | B2 * | 4/2006 | Mahadevan | H10W 42/20 |
| | | | | 257/659 |
| 7,892,889 | B2 * | 2/2011 | Howard | H10W 74/114 |
| | | | | 438/109 |
| 7,898,066 | B1 * | 3/2011 | Scanlan | H10W 42/20 |
| | | | | 257/422 |
| 8,012,868 | B1 * | 9/2011 | Naval | H10W 42/20 |
| | | | | 257/784 |
| 9,153,543 | B1 * | 10/2015 | Mangrum | H10W 42/60 |
| 9,788,466 | B2 * | 10/2017 | Chen | H05K 1/0216 |

| | | | | |
|---|---|---|---|---|
| 2007/0040735 | A1 * | 2/2007 | Matsuo | H05K 1/167 |
| | | | | 257/E23.114 |
| 2010/0046184 | A1 * | 2/2010 | Yasooka | H10W 76/13 |
| | | | | 361/767 |
| 2010/0091477 | A1 * | 4/2010 | Takagi | H10W 40/611 |
| | | | | 438/106 |
| 2020/0118950 | A1 * | 4/2020 | Fukunaga | H10W 44/20 |
| 2020/0227363 | A1 * | 7/2020 | Asada | H10W 44/20 |
| 2020/0402878 | A1 * | 12/2020 | Daniels | H10W 74/111 |
| 2021/0066237 | A1 | 3/2021 | Otsubo et al. | |

FOREIGN PATENT DOCUMENTS

| | | | | | |
|---|---|---|---|---|---|
| JP | 2005-311338 | A | | 11/2005 | |
| JP | 2011-119526 | A | | 6/2011 | |
| JP | 2012-009675 | A | | 1/2012 | |
| JP | 2014-003077 | A | | 1/2014 | |
| JP | 2020-027892 | A | | 2/2020 | |
| TW | 200814276 | A | * | 3/2008 | ......... H10W 74/117 |
| WO | 2019/230705 | A1 | | 12/2019 | |

OTHER PUBLICATIONS

"Notice of Reasons for Refusal" Office Action issued in JP 2022-503006; mailed by the Japanese Patent Office on Apr. 19, 2022.

* cited by examiner

HIGH-FREQUENCY SEMICONDUCTOR PACKAGE

FIELD

The present disclosure relates to a high-frequency semiconductor package.

BACKGROUND

In a high-frequency semiconductor package, an input pad and an output pad of a semiconductor chip are respectively connected by wires to an input feedthrough and an output feedthrough of a ceramic substrate. However, in a case of attempting to achieve an increase in gain of a high-frequency semiconductor amplifier, there is a problem in that an isolation distance between the input feedthrough and the output feedthrough is insufficient, so that electric radiation of an output signal is input to the input feedthrough to affect high-frequency characteristics. There is another problem in that size increase of the semiconductor chip causes a spatial resonant frequency of the package to shift to a lower frequency, which affects a desired frequency.

In contrast to this, inserting an electrically grounded shielding plate to partition the inside of a package into a region including a first integration circuit and a region including a second integration circuit has been proposed (for example, see PTL 1). Providing a projection on a lid member of a package to partition the inside of the package into a region including an input feedthrough and a region including an output feedthrough and grounding the lid member and the projection on the lid member has also been proposed. By providing an isolation wall electrically grounded so as to partition a region between adjacent circuits in this manner, an isolation distance between the circuits can be ensured.

CITATION LIST

Patent Literature

[PTL 1] JP 2005-050974 A

SUMMARY

Technical Problem

The position at which the isolation wall is to be provided varies depending on the size and structure of a semiconductor chip to be mounted as well as inner dimensions of a package. This raises a problem in that a dedicated design of the isolation wall in accordance with the semiconductor chip and the package is required, resulting in increased manufacturing cost.

The present disclosure has been made to solve the problems as described above, and has an object to obtain a high-frequency semiconductor package that ensures excellent isolation characteristics and can reduce manufacturing cost.

Solution to Problem

A high-frequency semiconductor package according to the present disclosure includes: a metal plate; a substrate provided on the metal plate and having an opening; a semiconductor chip provided on the metal plate in the opening and having an input pad and an output pad; an input feedthrough provided on the substrate and wire-connected to the input pad; an output feedthrough provided on the substrate, opposed to the input feedthrough with the opening interposed therebetween, and wire-connected to the output pad; a metal seal ring provided on the substrate and surrounding the opening, the input feedthrough and the output feedthrough; a through-hole extending through the substrate and electrically connecting the metal seal ring and the metal plate; a conductive cap bonded to the metal seal ring and covering a place above the semiconductor chip; and an isolation metal wire having both ends electrically connected to the metal plate and a loop coming into contact with a lower surface of the conductive cap, wherein the isolation metal wire constitutes an isolation wall partitioning an inner space, which is surrounded by the metal plate, the substrate, the metal seal ring, and the conductive cap, into a region including the input feedthrough and a region including the output feedthrough.

Advantageous Effects of Invention

In the present disclosure, the metal plate, the through-hole of the substrate, the metal seal ring, and the conductive cap are electrically connected to one another to constitute common GND. Therefore, the inner space surrounded by the metal plate, the substrate, the metal seal ring, and the conductive cap are electromagnetically shielded. The isolation metal wire constitutes an isolation wall that partitions the inner space into the region including the input feedthrough and the region including the output feedthrough. Therefore, the region on the input side and the region on the output side are separated in terms of high frequency, thus enabling excellent isolation characteristics to be ensured. The isolation metal wire can be mounted simultaneously with wire bonding of the semiconductor chip in a wire bonding step. A wire bonding position of the isolation metal wire can be selected flexibly in accordance with an outer shape of the semiconductor chip and an arrangement of peripheral components. Therefore, the versatility of the package will not be lost even if the isolation metal wire is provided. This eliminates the need for a dedicated design, and can reduce manufacturing cost.

DESCRIPTION OF EMBODIMENTS

A high-frequency semiconductor package according to the embodiments of the present disclosure will be described with reference to the drawings. The same components will be denoted by the same symbols, and the repeated description thereof may be omitted.

First Embodiment

Figure 1:
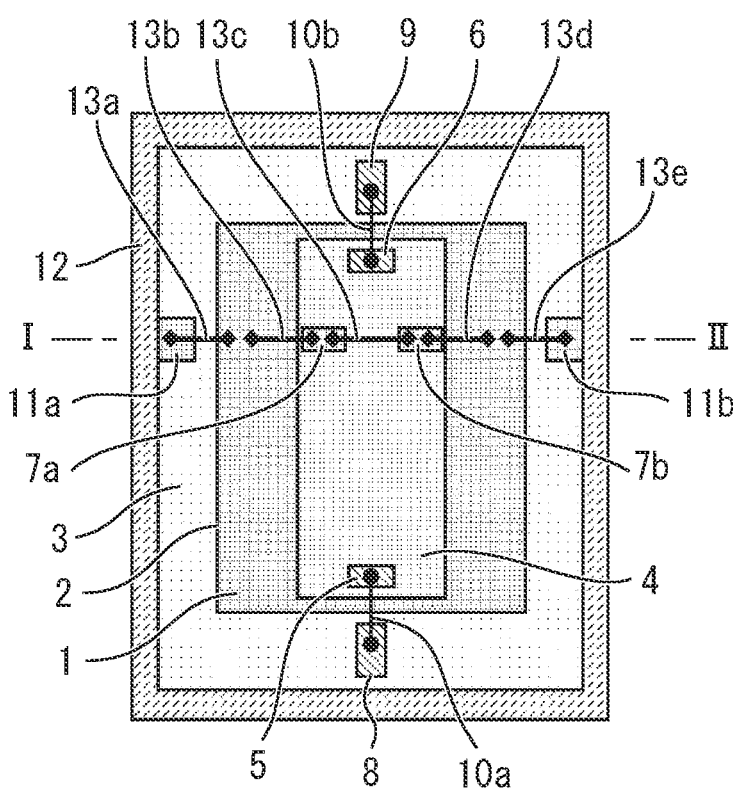
FIG. 1 is a top view showing the inside of a high-frequency semiconductor package according to a first embodiment.

FIG. 1 is a top view showing the inside of a high-frequency semiconductor package according to a first embodiment. A ceramic substrate 3 having an opening 2 is provided on a metal plate 1 which is a heat sink. The ceramic substrate 3 has a rectangular frame shape in plan view. A semiconductor chip 4 is provided on the metal plate 1 in the opening 2 of the ceramic substrate 3. An input pad 5, an output pad 6, and isolation pads 7a and 7b are provided on an upper surface of the semiconductor chip 4.

An input feedthrough 8 and an output feedthrough 9 are provided on the ceramic substrate 3 so as to be opposed to each other with the opening 2 interposed therebetween. The input pad 5 of the semiconductor chip 4 is electrically connected to the input feedthrough 8 by a metal wire 10a. The output pad 6 of the semiconductor chip 4 is electrically connected to the output feedthrough 9 by a metal wire 10b. The semiconductor chip 4 is a high-frequency semiconductor amplifier that amplifies a high-frequency signal received from the input feedthrough 8 for output to the output feedthrough 9.

Ground pads 11a and 11b are provided on the ceramic substrate 3 so as to be opposed to each other with the opening 2 interposed therebetween. The isolation pads 7a, 7b and the ground pads 11a, 11b are arranged along a straight line in plan view.

A metal seal ring 12 is provided on a peripheral portion of the ceramic substrate 3 so as to surround the opening 2, the input feedthrough 8, the output feedthrough 9, and the ground pads 11a and 11b.

An isolation metal wire 13a is connected to the ground pad 11a and the metal plate 1. An isolation metal wire 13b is connected to the metal plate 1 and the isolation pad 7a. An isolation metal wire 13c is connected to the isolation pad 7a and the isolation pad 7b. An isolation metal wire 13d is connected to the isolation pad 7b and the metal plate 1. An isolation metal wire 13e is connected to the metal plate 1 and the ground pad 11b. Both ends of each of the isolation metal wires 13a to 13e are electrically connected to the metal plate 1 directly or indirectly. The isolation metal wires 13a to 13e are arranged in line in plan view. The isolation metal wires 13a to 13e partition an inner space of the package into a region including the input feedthrough 8 and a region including the output feedthrough 9.

Figure 2:
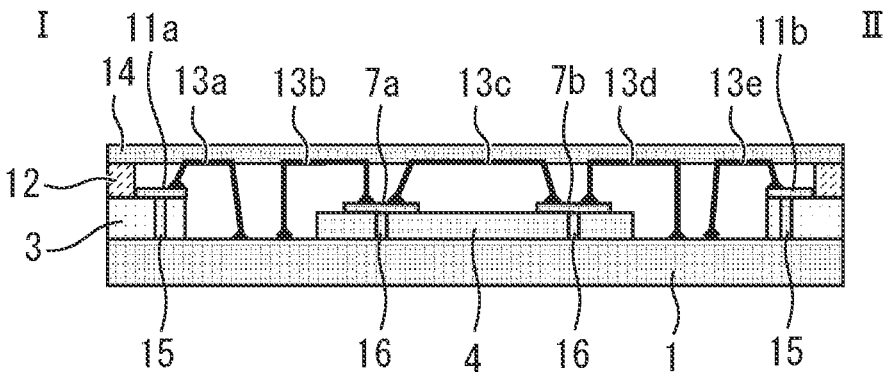
FIG. 2 is a cross-sectional view taken along I-II in FIG. 1.
Figure 3:
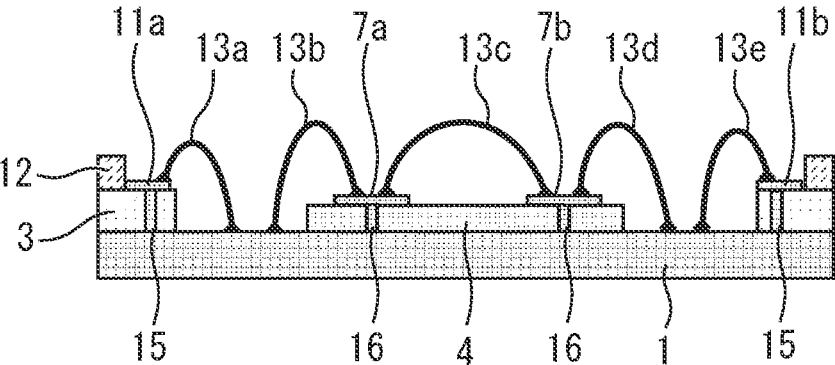
FIG. 3 is a cross-sectional view taken along I-II in FIG. 1.

FIG. 2 and FIG. 3 are cross-sectional views taken along I-II in FIG. 1. FIG. 2 shows a state after sealing, and a conductive cap 14 is bonded to the metal seal ring 12 and covers a place above the semiconductor chip 4. FIG. 3 shows a state before sealing with the conductive cap 14.

The ground pads 11a and 11b are electrically connected to the metal plate 1 via through-holes 15 extending vertically through the ceramic substrate 3. The metal seal ring 12 is electrically connected to the metal plate 1 via the through-holes 15 and the ground pads 11a and 11b.

A metal (not shown) is formed on the entire rear surface of the semiconductor chip 4. The metal is electrically connected to the metal plate 1 by soldering, for example. The isolation pads 7a and 7b are electrically connected to the metal and the metal plate 1 through via-holes 16 extending vertically through the semiconductor chip 4.

In the state before sealing, the isolation metal wires 13a to 13e have such loops that they are higher than the position of the upper surface of the metal seal ring 12. At the time of sealing, the loops of the isolation metal wires 13a to 13e come into contact with a lower surface of the conductive cap 14, are deformed, and are electrically connected.

As described above, in the present embodiment, the metal plate 1, the through-holes 15 of the ceramic substrate 3, the metal seal ring 12, and the conductive cap 14 are electrically connected to one another to constitute common GND. Therefore, the inner space surrounded by the metal plate 1, the ceramic substrate 3, the metal seal ring 12, and the conductive cap 14 are electromagnetically shielded. The isolation metal wires 13a to 13e constitute an isolation wall that partitions the inner space into the region including the input feedthrough 8 and the region including the output feedthrough 9. Therefore, the region on the input side and the region on the output side are separated in terms of high frequency, thus enabling excellent isolation characteristics to be ensured. The isolation metal wires 13a to 13e can be mounted simultaneously with wire bonding of the semiconductor chip 4 in a wire bonding step. Wire bonding positions of the isolation metal wires 13a to 13e can be selected flexibly in accordance with an outer shape of the semiconductor chip 4 and an arrangement of peripheral components. Therefore, the versatility of the package will not be lost even if the isolation metal wires 13a to 13e are provided. This eliminates the need for a dedicated design, and can reduce manufacturing cost.

In addition, the spatial resonant frequency can be shifted to a higher frequency side than in a case where the isolation metal wires 13a to 13e are not provided because the spatial resonant frequency is determined by the dimensions of the inner space.

The distance between an end of the isolation metal wire 13a connected to the ground pad 11a, and the metal seal ring 12 shall be $\frac{1}{4}\lambda$ or less where $\lambda$ indicates a wavelength corresponding to a desired frequency of a high-frequency signal to be amplified by the semiconductor chip 4. The interval between adjacent wire ends of the isolation metal wires 13a to 13e shall be $\frac{1}{4}\lambda$ or less. The distance between an end of the isolation metal wire 13e connected to the ground pad 11b, and the metal seal ring 12 shall be $\frac{1}{4}\lambda$ or less. This enables excellent isolation characteristics to be obtained with the input feedthrough 8 and the output feedthrough 9 at the desired frequency or less. When these distances are narrowed further, excellent isolation characteristics can also be obtained at higher frequencies.

Second Embodiment

Figure 4:
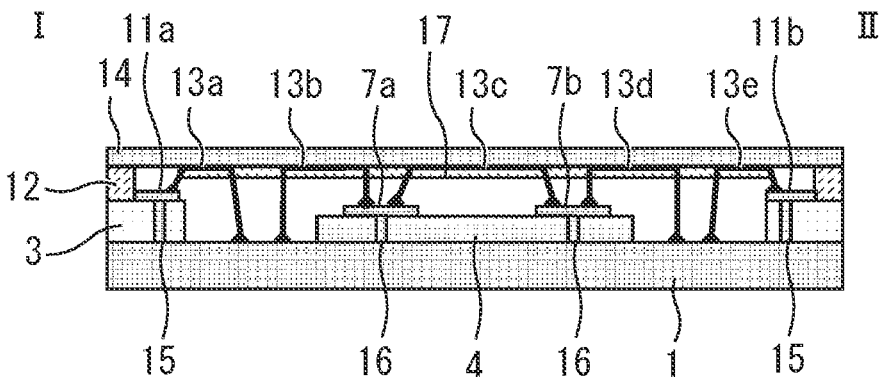
FIG. 4 is a cross-sectional view showing a high-frequency semiconductor package according to a second embodiment.

FIG. 4 is a cross-sectional view showing a high-frequency semiconductor package according to a second embodiment. The lower surface of the conductive cap 14 is coated with a solder 17. The isolation metal wires 13a to 13e and the conductive cap 14 are bonded with the solder 17. Solder bonding improves a mechanical strength of bonding portions between the isolation metal wires 13a to 13e and the conductive cap 14, and can restrict displacement of the isolation metal wires 13a to 13e that would be caused by vibrations or an impact. In addition, filling a gap between the isolation metal wires 13a to 13e and the conductive cap 14 with the solder 17 improves isolation characteristics. In addition, since the solder 17 is used for bonding, there is no risk that material-derived gas will be produced in a hermetically sealed package to contaminate the semiconductor chip 4.

Third Embodiment

Figures 5, 6:
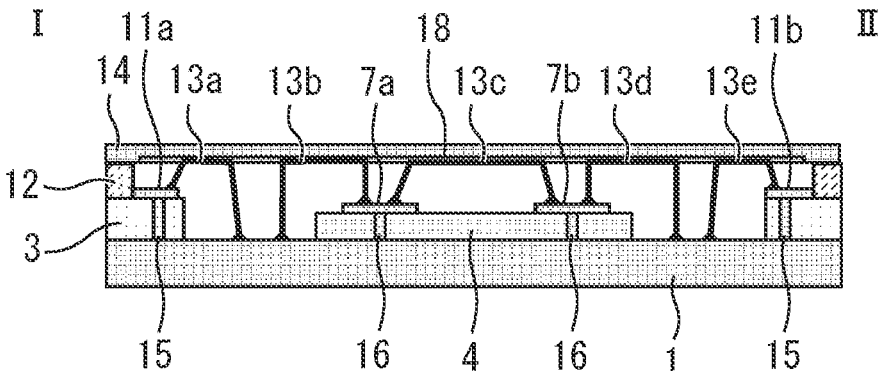
FIG. 5 is a cross-sectional view showing a high-frequency semiconductor package according to a third embodiment.
FIG. 6 is a lower view showing a conductive cap according to the third embodiment.
Figure 7:
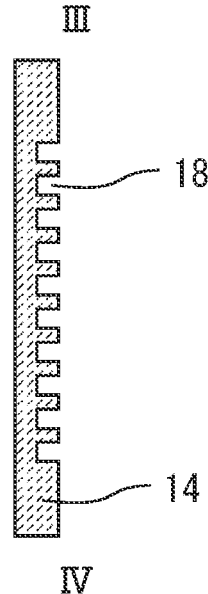
FIG. 7 is a cross-sectional view taken along III-IV in FIG. 6.

FIG. 5 is a cross-sectional view showing a high-frequency semiconductor package according to a third embodiment. FIG. 6 is a lower view showing a conductive cap according to the third embodiment. FIG. 7 is a cross-sectional view taken along III-IV in FIG. 6. A plurality of slits 18 is provided parallel to one another in the lower surface of the conductive cap 14.

Figure 8:
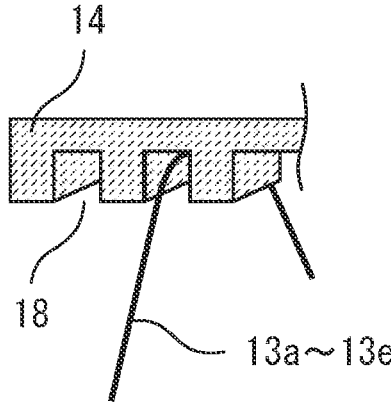
FIG. 8 is a perspective view showing a positional relationship between the isolation metal wires and the slits.

FIG. 8 is a perspective view showing a positional relationship between the isolation metal wires and the slits. Each of the slits 18 has a width larger than a wire diameter of the isolation metal wires 13a to 13e. The loops of the isolation metal wires 13a to 13e are fitted within some of the plurality of slits 18. This can restrict displacement of the isolation metal wires 13a to 13e that would be caused by vibrations or an impact.

In addition, the plurality of slits 18 are provided in parallel in the entire surface excluding a region in which the conductive cap 14 is bonded to the metal seal ring 12. Thus, even if the slits 18 are provided, flexibility in mounting the isolation metal wires 13a to 13e is not lost.

Fourth Embodiment

Figure 9:
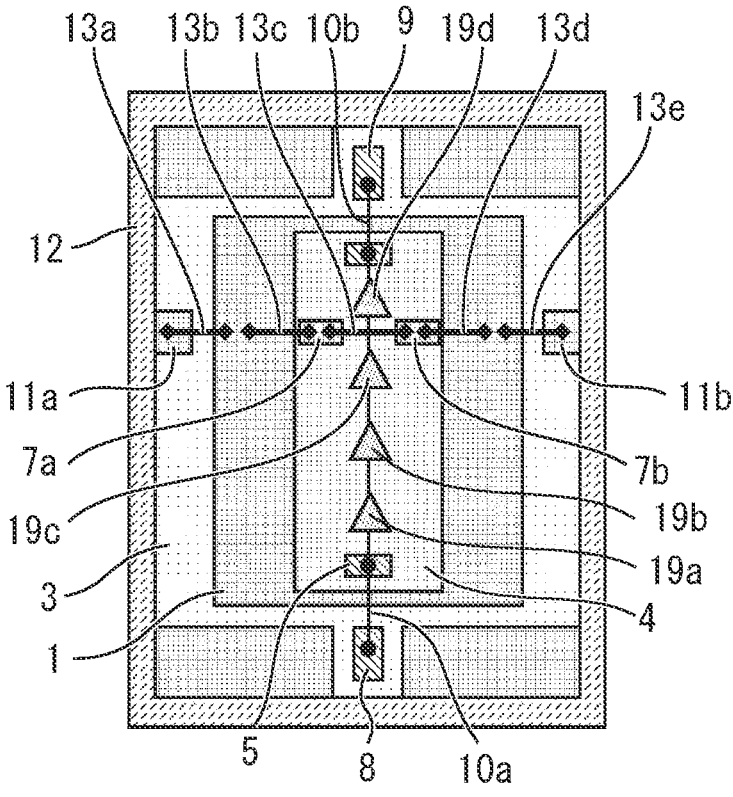
FIG. 9 is a top view showing the inside of a high-frequency semiconductor package according to a fourth embodiment.

FIG. 9 is a top view showing the inside of a high-frequency semiconductor package according to a fourth embodiment. The semiconductor chip 4 has multi-stage amplifiers 19a to 19d. The isolation metal wire 13c partitions the inner space into a region including the amplifier 19d of the last stage and a region including the amplifier 19c of a stage preceding the last stage. Isolation between the amplifier 19d of the last stage and the amplifier 19c of the stage preceding the last stage is ensured, and electric radiation from the amplifier 19d of the last stage with a large output can be prevented from affecting an input signal of the amplifier 19c of the stage preceding the last stage to degrade high-frequency characteristics.

Fifth Embodiment

Figure 10:
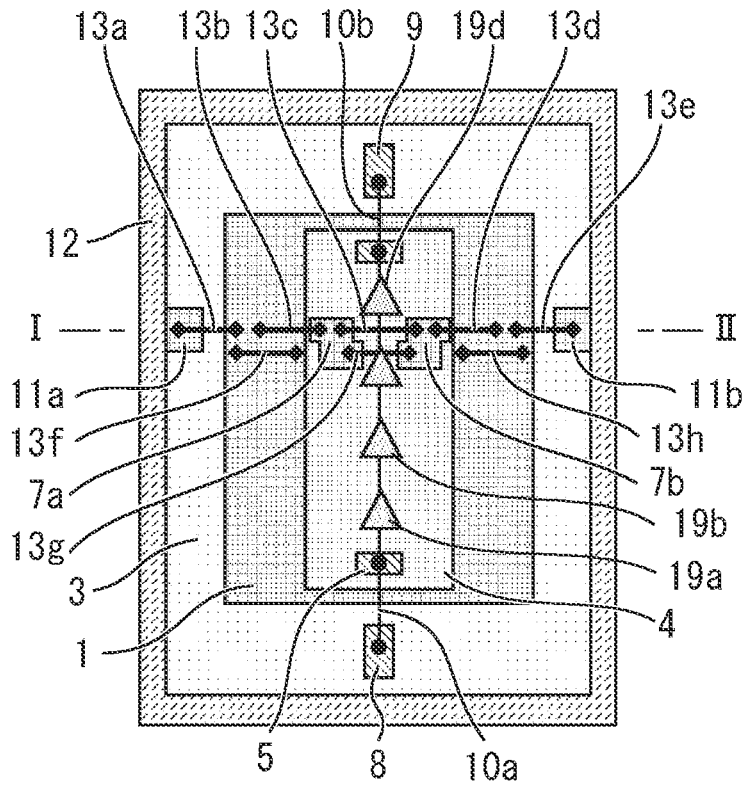
FIG. 10 is a top view showing the inside of a high-frequency semiconductor package according to a fifth embodiment.
Figure 11:
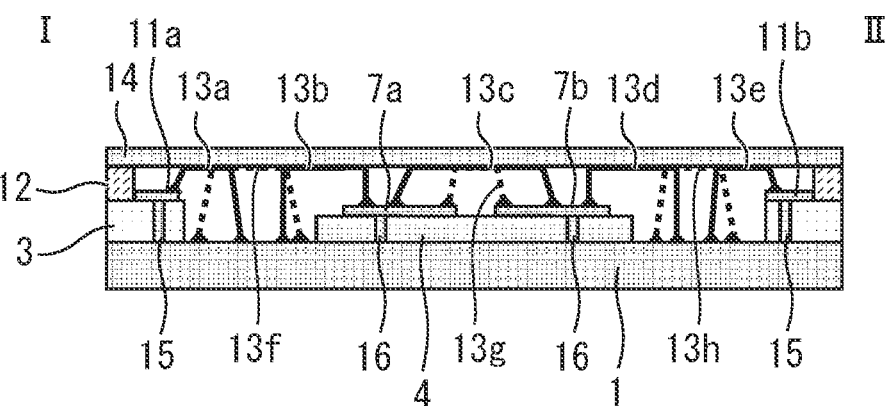
FIG. 11 is a cross-sectional view taken along I-II in FIG. 10.

FIG. 10 is a top view showing the inside of a high-frequency semiconductor package according to a fifth embodiment. FIG. 11 is a cross-sectional view taken along I-II in FIG. 10. Ends of the isolation metal wires 13f to 13h are connected to the metal plate 1 or the isolation pads 7a and 7b and are grounded. The ends of the isolation metal wires 13f to 13h are arranged respectively between ends of the isolation metal wires 13a to 13e. The interval from an adjacent wire end is ¼λ or less.

The loops of the isolation metal wires 13f to 13h before sealing are set to be higher than the upper surface of the metal seal ring 12. Therefore, the isolation metal wires 13f to 13h are brought into contact with the conductive cap 14 by sealing, so that an isolation wall is formed. In other words, the isolation metal wires 13a to 13h arrayed in two rows in a staggered manner constitute the isolation wall. Since apexes of the loops of the isolation metal wires 13f to 13h do not overlap apexes of the loops of the isolation metal wires 13a to 13e, a cross-section of a cavity is partitioned more finely than in the first embodiment.

In the present embodiment, the metal wires 13a to 13h arrayed in two rows in a staggered manner constitute the isolation wall. Thus, more excellent isolation characteristics than the isolation characteristics of the first embodiment in which the plurality of metal wires 13a to 13e are arranged in line can be obtained. If isolation characteristics equivalent to the isolation characteristics of the present embodiment are to be obtained with a wire group in a single row, mounting performance degrades due to a steep loop shape of the wires. Note that although the wire groups in two rows constitute the isolation wall of the present embodiment, the present disclosure is not limited to this, and the number of rows and the pitch of wires can be adjusted in order to obtain desired isolation characteristics.

REFERENCE SIGNS LIST 1 metal plate; 2 opening; 3 ceramic substrate; 4 semiconductor chip; 5 input pad; 6 output pad; 7 isolation pad; 8 input feedthrough; 9 output feedthrough; 11 ground pad; 12 metal seal ring; 13a~13h isolation metal wire; 14 conductive cap; 15 through-hole; 17 solder; 18 slit; 19a~19d amplifier

The invention claimed is:

1. A high-frequency semiconductor package comprising:
a metal plate;
a substrate provided on the metal plate and having an opening;
a semiconductor chip provided on the metal plate in the opening and having an input pad and an output pad;
an input feedthrough provided on the substrate and wire-connected to the input pad;
an output feedthrough provided on the substrate, opposed to the input feedthrough with the opening interposed therebetween, and wire-connected to the output pad;
a metal seal ring provided on the substrate and surrounding the opening, the input feedthrough and the output feedthrough;
a through-hole extending through the substrate and electrically connecting the metal seal ring and the metal plate;
a conductive cap bonded to the metal seal ring and covering a place above the semiconductor chip; and
an isolation metal wire having both ends electrically connected to the metal plate and a loop coming into contact with a lower surface of the conductive cap,
wherein the isolation metal wire constitutes an isolation wall partitioning an inner space, which is surrounded by the metal plate, the substrate, the metal seal ring, and the conductive cap, into a region including the input feedthrough and a region including the output feedthrough,
a lower surface of the conductive cap is coated with a solder, and
the isolation metal wire and the conductive cap are bonded with the solder.

2. The high-frequency semiconductor package according to claim 1, wherein the isolation metal wire includes a plurality of wires arranged in line.

3. The high-frequency semiconductor package according to claim 2, further comprising first and second ground pads provided on the substrate, opposed to each other with the opening interposed therebetween, and electrically connected to the metal plate via the through-hole, wherein the semiconductor chip has first and second isolation pads electrically connected to the metal plate, and the plurality of wires includes a first wire connected to the first ground pad and the metal plate, a second wire connected to the metal plate and the first isolation pad, a third wire connected to the first and second isolation pads, a fourth wire connected to the second isolation pad and the metal plate, and a fifth wire connected to the metal plate and the second ground pad.

4. A high-frequency semiconductor package comprising:

a metal plate;

a substrate provided on the metal plate and having an opening;

a semiconductor chip provided on the metal plate in the opening and having an input pad and an output pad;

an input feedthrough provided on the substrate and wire-connected to the input pad;

an output feedthrough provided on the substrate, opposed to the input feedthrough with the opening interposed therebetween, and wire-connected to the output pad;

a metal seal ring provided on the substrate and surrounding the opening, the input feedthrough and the output feedthrough;

a through-hole extending through the substrate and electrically connecting the metal seal ring and the metal plate;

a conductive cap bonded to the metal seal ring and covering a place above the semiconductor chip; and an isolation metal wire having both ends electrically connected to the metal plate and a loop coming into contact with a lower surface of the conductive cap, wherein the isolation metal wire constitutes an isolation wall partitioning an inner space, which is surrounded by the metal plate, the substrate, the metal seal ring, and the conductive cap, into a region including the input feedthrough and a region including the output feedthrough, a plurality of slits are provided parallel to one another in a lower surface of the conductive cap, each of the slits has a width larger than a wire diameter of the isolation metal wire, and the loop of the isolation metal wire is fitted within any one of the plurality of slits.

5. A high-frequency semiconductor package comprising:

a metal plate;

a substrate provided on the metal plate and having an opening;

a semiconductor chip provided on the metal plate in the opening and having an input pad and an output pad;

an input feedthrough provided on the substrate and wire-connected to the input pad;

an output feedthrough provided on the substrate, opposed to the input feedthrough with the opening interposed therebetween, and wire-connected to the output pad;

a metal seal ring provided on the substrate and surrounding the opening, the input feedthrough and the output feedthrough;

a through-hole extending through the substrate and electrically connecting the metal seal ring and the metal plate;

a conductive cap bonded to the metal seal ring and covering a place above the semiconductor chip; and an isolation metal wire having both ends electrically connected to the metal plate and a loop coming into contact with a lower surface of the conductive cap, wherein the isolation metal wire constitutes an isolation wall partitioning an inner space, which is surrounded by the metal plate, the substrate, the metal seal ring, and the conductive cap, into a region including the input feedthrough and a region including the output feedthrough, the semiconductor chip has multi-stage amplifiers, and the isolation metal wire partitions the inner space into a region including the amplifier of the last stage and a region including the amplifier of a stage preceding the last stage.

6. A high-frequency semiconductor package comprising:

a metal plate;

a substrate provided on the metal plate and having an opening;

a semiconductor chip provided on the metal plate in the opening and having an input pad and an output pad;

an input feedthrough provided on the substrate and wire-connected to the input pad;

an output feedthrough provided on the substrate, opposed to the input feedthrough with the opening interposed therebetween, and wire-connected to the output pad;

a metal seal ring provided on the substrate and surrounding the opening, the input feedthrough and the output feedthrough;

a through-hole extending through the substrate and electrically connecting the metal seal ring and the metal plate;

a conductive cap bonded to the metal seal ring and covering a place above the semiconductor chip; and an isolation metal wire having both ends electrically connected to the metal plate and a loop coming into contact with a lower surface of the conductive cap, wherein the isolation metal wire constitutes an isolation wall partitioning an inner space, which is surrounded by the metal plate, the substrate, the metal seal ring, and the conductive cap, into a region including the input feedthrough and a region including the output feedthrough, and the isolation metal wire includes metal wires arrayed in two rows in a staggered manner.

7. The high-frequency semiconductor package according to claim 4, wherein the isolation metal wire includes a plurality of wires arranged in line.

8. The high-frequency semiconductor package according to claim 7, further comprising first and second ground pads provided on the substrate, opposed to each other with the opening interposed therebetween, and electrically connected to the metal plate via the through-hole, wherein the semiconductor chip has first and second isolation pads electrically connected to the metal plate, and the plurality of wires includes a first wire connected to the first ground pad and the metal plate, a second wire connected to the metal plate and the first isolation pad, a third wire connected to the first and second isolation pads, a fourth wire connected to the second isolation pad and the metal plate, and a fifth wire connected to the metal plate and the second ground pad.

9. The high-frequency semiconductor package according to claim 5, wherein the isolation metal wire includes a plurality of wires arranged in line.

10. The high-frequency semiconductor package according to claim 9, further comprising first and second ground pads provided on the substrate, opposed to each other with the opening interposed therebetween, and electrically connected to the metal plate via the through-hole, wherein the semiconductor chip has first and second isolation pads electrically connected to the metal plate, and the plurality of wires includes a first wire connected to the first ground pad and the metal plate, a second wire connected to the metal plate and the first isolation pad, a third wire connected to the first and second isolation pads, a fourth wire connected to the second isolation pad and the metal plate, and a fifth wire connected to the metal plate and the second ground pad.

* * * * *